United States Patent
Wu et al.

(10) Patent No.: US 9,478,669 B2
(45) Date of Patent: Oct. 25, 2016

(54) THIN FILM TRANSISTOR AND DISPLAY ARRAY SUBSTRATE USING SAME

(71) Applicant: Ye Xin Technology Consulting Co., Ltd., Hsinchu (TW)

(72) Inventors: I-Wei Wu, Hsinchu (TW); I-Min Lu, Hsinchu (TW); Wei-Chih Chang, Hsinchu (TW); Hui-Chu Lin, Hsinchu (TW); Yi-Chun Kao, Hsinchu (TW); Kuo-Lung Fang, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/467,444

(22) Filed: Aug. 25, 2014

(65) Prior Publication Data

US 2015/0053974 A1    Feb. 26, 2015

(30) Foreign Application Priority Data

Aug. 23, 2013 (TW) .............................. 102130379 A

(51) Int. Cl.
| | | |
|---|---|---|
| *H01L 29/10* | (2006.01) | |
| *H01L 29/786* | (2006.01) | |
| *H01L 29/66* | (2006.01) | |
| *H01L 21/3105* | (2006.01) | |
| *H01L 21/311* | (2006.01) | |

(52) U.S. Cl.
CPC ..... *H01L 29/7869* (2013.01); *H01L 21/31058* (2013.01); *H01L 21/31144* (2013.01); *H01L 29/66765* (2013.01); *H01L 29/66969* (2013.01); *H01L 29/78606* (2013.01)

(58) Field of Classification Search
CPC .................... H01L 29/66765; H01L 29/7869; H01L 29/66969; H01L 29/78606
USPC .......................................................... 257/43
See application file for complete search history.

(56) References Cited

U.S. PATENT DOCUMENTS

| | | | |
|---|---|---|---|
| 2009/0256147 A1 | 10/2009 | Kim et al. | |
| 2012/0205658 A1* | 8/2012 | Yamazaki ........... | H01L 27/1244 257/66 |

FOREIGN PATENT DOCUMENTS

TW            201327835 A1    7/2013

* cited by examiner

*Primary Examiner* — Douglas Menz
(74) *Attorney, Agent, or Firm* — Zhigang Ma

(57) ABSTRACT

A thin film transistor includes a gate electrode, a gate insulating layer, a channel layer, an etching stop layer, two contact holes, a source, and a drain. The gate insulating layer covers the gate electrode. The channel layer is arranged on the gate insulating layer corresponding to the gate electrode. The etching stop layer covers the channel layer and includes an organic stop layer and a hard mask layer, the hard mask layer is located on a surface of the organic stop layer opposite to the channel layer to enhance a hardness of the organic stop layer. The two contact holes pass through the etching stop layer. The source connects to the channel via one contact hole, and the drain connects to the channel via the other contact hole.

16 Claims, 10 Drawing Sheets

THIN FILM TRANSISTOR AND DISPLAY ARRAY SUBSTRATE USING SAME

CROSS-REFERENCE TO RELATED APPLICATIONS

This application claims priority to Taiwanese Patent Application No. 102130379 filed on Aug. 23, 2013 in the Taiwan Intellectual Property Office, the contents of which are incorporated by reference herein.

FIELD

The disclosure generally relates to a thin film transistor utilized in a display array substrate.

BACKGROUND

A channel layer of a thin film transistor can be made of metal oxide semiconductor. An etching stop layer can be arranged on the channel layer to protect the metal oxide semiconductor. A thickness of the etching stop layer is generally greater than 100 nanometers. However, in etching stop (ES) process a resolution of exposing a through hole in the etching stop layer is not high enough to achieve a shorter channel length between a source electrode and a drain electrode of the thin film transistor.

BRIEF DESCRIPTION OF THE DRAWINGS

Implementations of the present technology will now be described, by way of example only, with reference to the attached figures.

DETAILED DESCRIPTION

Figure 1:
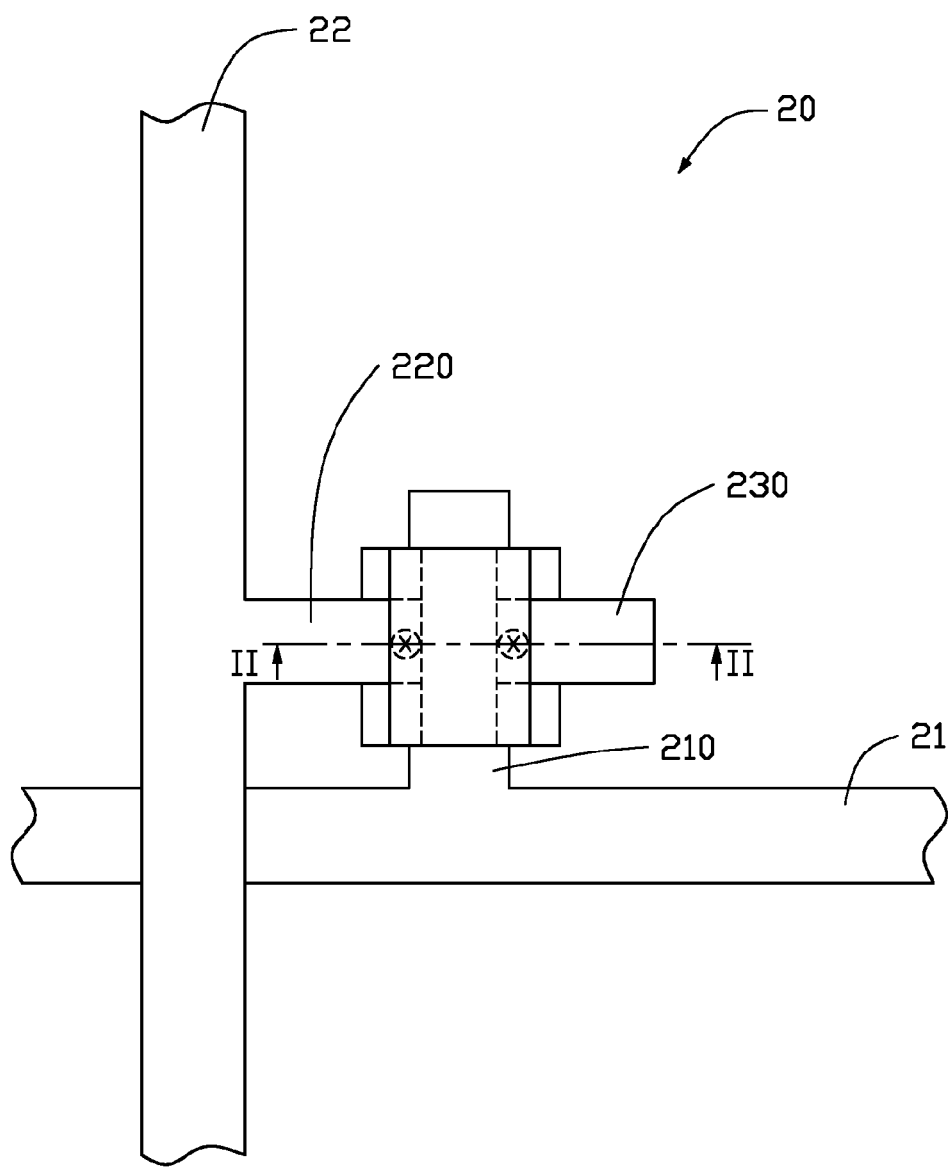
FIG. 1 is a partially sectioned isometric view of a pixel electrode of a display array substrate having a thin film transistor according the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Referring to FIG. 1, a display array substrate 20 can include a plurality of gate lines 21 and a plurality of data lines 22. The gate lines 21 are parallel to each other. The data lines 22 are parallel to each other, and isolately intersect with the gate lines 21. The data lines 22 and the gate lines 21 define multiple intersections where the data lines 22 cross the gate lines 21. A thin film transistor (TFT) 200 is arranged on each of the multiple intersections. The thin film transistor 200 can include a gate electrode 210, a source electrode 220, and a drain electrode 230. The gate electrode 210 is electrically connected to one gate line 21 to receive a gate signal which is output by a gate driver (not shown). The source electrode 220 is electrically connected to one data line 22 to receive a data signal which is output by a data driver (not shown).

Figure 2:
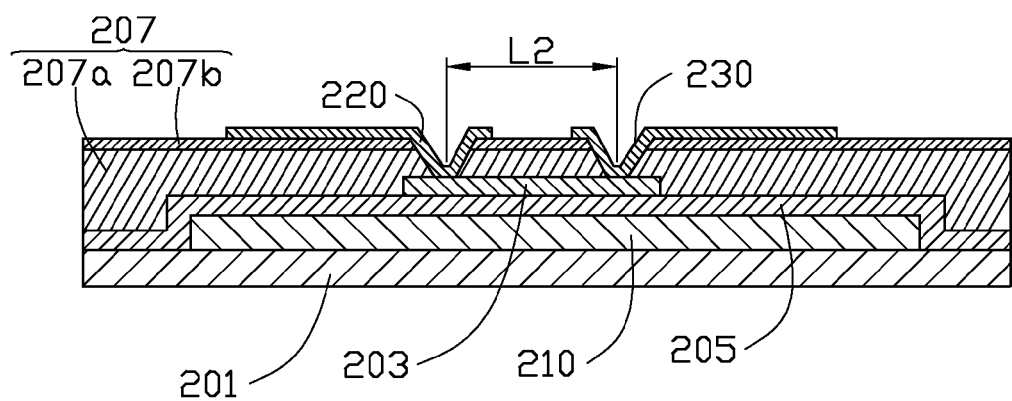
FIG. 2 is a sectional view of the thin film transistor of along line II-II of FIG. 1.

When a potential of the gate signal is greater than a threshold potential of the thin film transistor 200, a channel layer 203 (as shown in FIG. 2) is turned on, thus the data signal is output to the drain electrode 230 via the source electrode 220.

FIG. 2 shows a section view of a thin film transistor 200 along line II-II of FIG. 1. The thin film transistor 200 can include a gate electrode 210, a channel layer 203, and a gate insulating layer 210. The gate electrode 210 is formed on a substrate 201. The channel layer 203 is arranged on the gate insulating layer 210 to correspond to the gate electrode 210. The thin film transistor 200 can further include an etching stop layer 207 protectively covering the channel layer 203. In the embodiment, the etching stop layer 207 can include an organic stop layer 207a and a hard mask layer 207b. The hard mask layer 207b is stacked up on the organic stop layer 207a. The organic stop layer 207a can be a transparent organic material layer after a curing process. The hard mask layer 207 is arranged on a surface of the organic stop layer 207a opposite to the substrate 201 to enhance a hardness of the organic stop layer 207a. In the embodiment, a thickness of the hard mask layer 207b is less than a thickness of the organic stop layer 207a. Two contact holes O21 and O22 penetrate the etching stop layer 207 to expose the channel layer 207. A distance between the two contact holes O21 and O22 defines a channel length L2. In the embodiment, the distance between the two contact holes O21 and O22 is less than ten micrometers. The preferred distance between the two contact holes O21 and O22 is about 3-5 micrometers.

The thin film transistor 200 can further include a source electrode 220 and a drain electrode 230. The channel layer 203 is coupled between the source electrode 220 and the drain electrode 230. The source electrode 220 and the drain electrode 230 make contact with the channel layer 203 via the two contact holes O21 and O22.

FIGS. 3-9 show sectional views illustrating a manufacturing method of the thin film transistor 200. FIG. 10 shows a flowchart of the manufacturing method of the thin film transistor 200.

Figure 3:
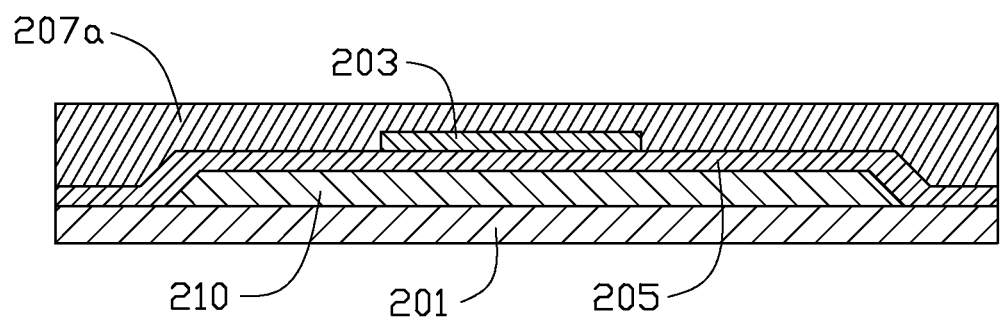
FIGS. 3-9 are sectional views illustrating a manufacturing method of the thin film transistor of FIG. 10.

At block 401, referring to FIG. 3, a gate electrode 210 and a gate insulating layer 205 are formed on the substrate 201. In detail, a first metal layer is deposited on the substrate 201, and then the first metal layer is patterned to form the gate electrode 210. The gate insulating layer 205 is coated on the gate electrode 210. In the embodiment, the first metal layer is etched by a photo lithography process. The substrate 201 can be a glass substrate or a quartz substrate. The first metal layer can include molybdenum (Mo), aluminum (Al), chromium (Cr), copper (Cu), or neodymium (Nd). The gate insulating layer 205 can include silicon nitride (SiNx) or Silicon oxide (SiOx). In the embodiment, the gate insulating layer 205 can be formed by a sputtering process, a vacuum evaporation process, a pulsed laser deposition (PLD) process, or a Plasma Enhanced CVD (PECVD) process.

At block 403, referring also to FIG. 3, the channel layer 203 is formed on the gate insulating layer 205 to correspond to the gate electrode 210, and the organic stop layer 207a is coated on the channel layer 203. The channel layer 203 can be metal oxide semiconductor, such as, indium gallium zinc oxide (IGZO), zinc oxide (ZnO), indium oxide (InO), gallium oxide (GaO), or the like. In the embodiment, a metal oxide semiconductor layer is formed on the gate insulating layer 205 by sputtering process, vacuum evaporation process, pulsed laser deposition (PLD) process, or Plasma Enhanced CVD (PECVD) process, and then the metal semiconductor layer is patterned to form the channel layer 203. A material of the organic stop layer 207a is organic and transparent. In the embodiment, a photosensitivity of the organic stop layer 207a is worst than a photosensitivity of a photoresistor. The organic stop layer 207a protects the channel layer 203 against damage of subsequent processes, and a thickness of the organic stop layer 207a is generally greater than 100 nanometers up to a few micrometer.

At block 405, the organic stop layer 207a is hard-baked to be flat and solid. The hard-baking process of the organic stop layer 207a can enhance adhesion between the organic stop layer 207a and the channel layer 203. In the embodiment, the organic stop layer 207a is hard-baked under a temperature condition of 100° C.-400° C. Residual organic solvents of the organic stop layer 207a is evaporated in the hard-baking process, thus the organic stop layer 207a becomes solid and the adhesion between the etching stop layer and the channel layer 203 is enhanced.

Figure 4:
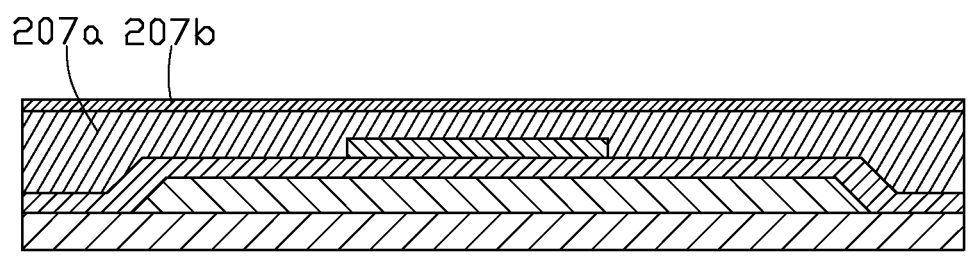

At block 407, referring to FIG. 4, the hard mask layer 207b is formed on the organic stop layer 207a. The hard mask layer 207b is stacked up with the organic stop layer 207a to form the etching stop layer 207. In the embodiment, a thickness of the hard mask layer 207b is less than a thickness of the organic stop layer 207a. The hard mask layer 207b can include silicon nitride (SiNx), Silicon oxide (SiOx), silicon fluorion (SiFx), and silicon nitride oxide (SiNxOy). In one embodiment, the hard mask layer 207b is formed by a chemical vapor deposition (CVD) process or a sputtering process.

Figure 5:
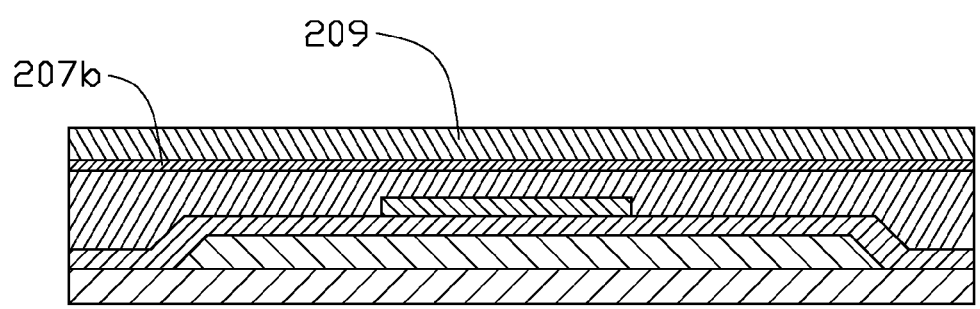

At block 409, referring to FIG. 5, a photoresistor layer 209 is coated on the etching stop layer 207.

Figure 6:
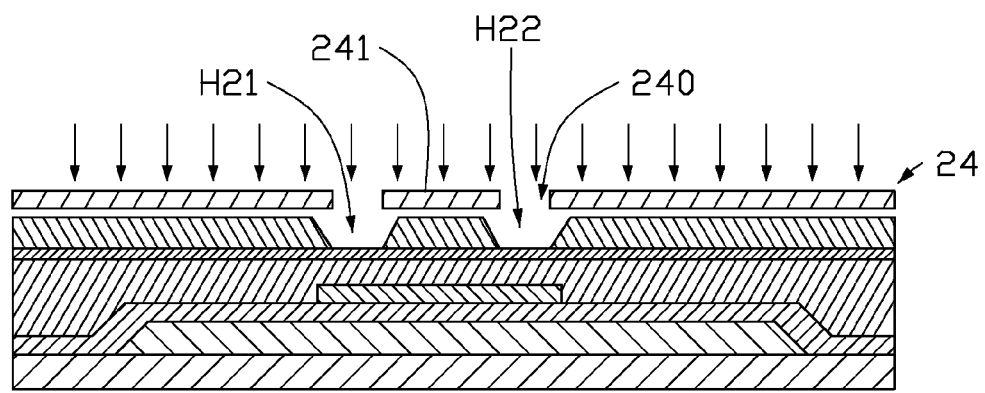

At block 411, referring to FIG. 6, the photoresistor layer 209 is patterned and two through holes H21 and H22 are defined on the patterned photoresistor layer 209. In detail, the photoresistor layer 209 is exposed and developed to define the two through holes H21 and H22 using a photomask 24. A distance between the two through holes H21 and H22 can be a predetermined channel length. In the embodiment, the distance between the two through holes H21 and H22 is about 3-5 micrometers. The photomask 24 can include two transmission portions 240 and a shading portion 241. A distance between the two transmission portions 240 that defines the distance between the two through holes H21 and H22.

Figure 7:
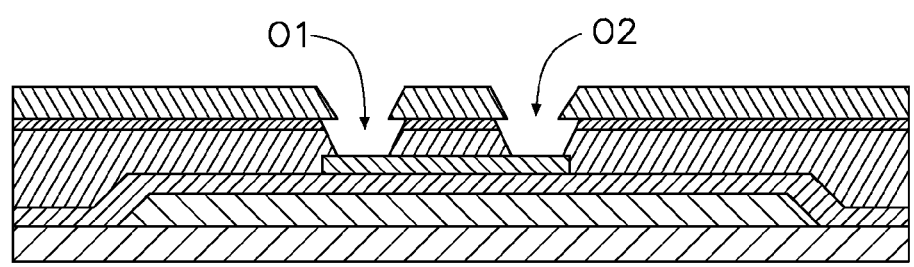

At block 413, referring to FIG. 7, two contact holes O21 and O22 are formed by etching the organic stop layer 207a and the hard mask layer 207b to the channel layer 207 with the patterned photoresistor layer 209 as a mask. The two contact holes O21 and O22 make respective contact with the two through holes H21 and H22. In the embodiment, the organic stop layer 207a and the hard mask layer 207b are etched by a dry-etching method, such as a plasma etching or reactive ion etching (RIE) method. A distance between the two contact holes O21 and O22 is substantially equal to the channel length L2.

Figure 8:
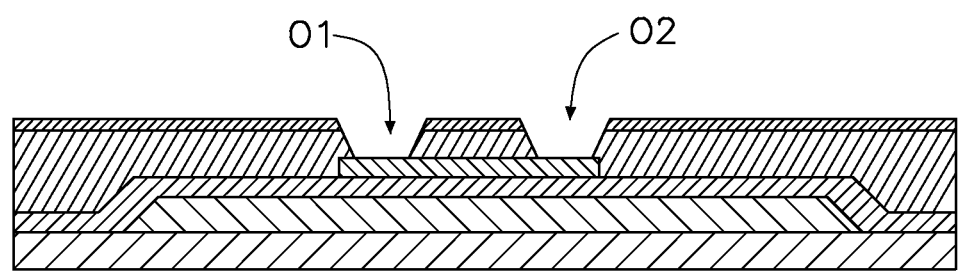

At block 415, referring to FIG. 8, a residual photoresistor layer 209 is stripped away.

Figure 9:
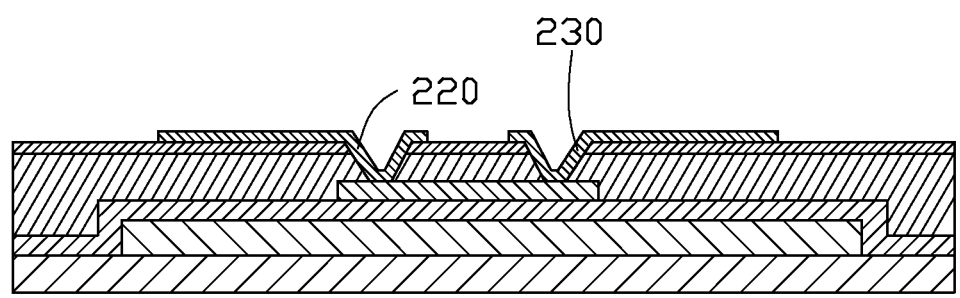
Figure 10:
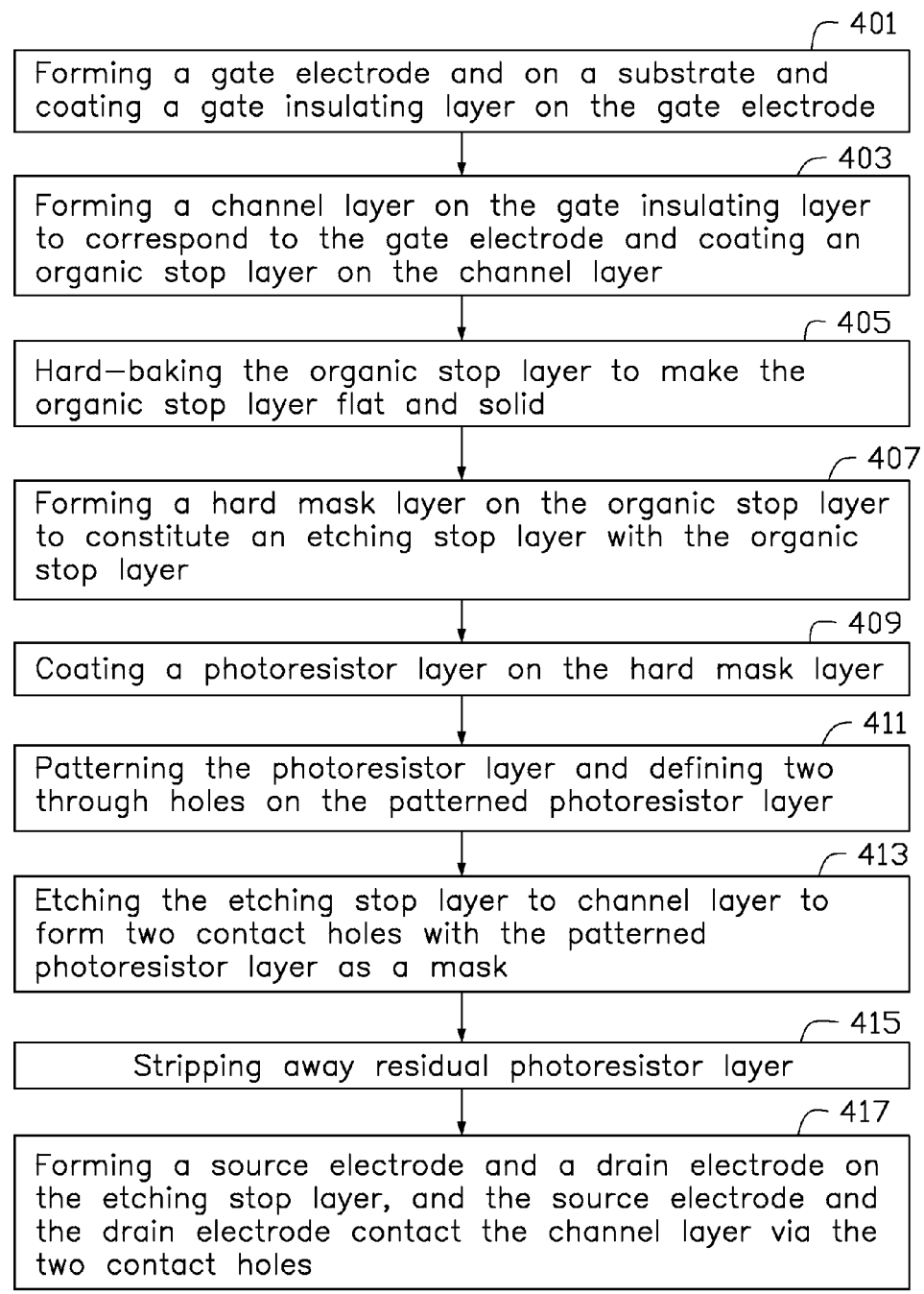
FIG. 10 is a flowchart of the manufacturing method of the thin film transistor of FIG. 1.

At block 417, referring to FIG. 9, the source electrode 220 and the drain electrode 230 are formed on the hard mask layer 207b. The source electrode 220 and the drain electrode 230 infill the two contact holes O21 and O22 to make contact with the channel layer 203. In detail, a second metal layer is deposited on the hard mask layer 207b, and then the source electrode 220 and the drain electrode 230 are formed in a mask process by patterning the second metal layer. The first metal layer can include molybdenum (Mo), aluminum (Al), chromium (Cr), copper (Cu), or neodymium (Nd).

When the thin film transistors 200 is used in a liquid crystal display panel, by a subsequent process, a planar layer and a pixel structure will be formed.

In summary, the thin film transistor includes a hard-baking layer and an etching stop layer, and two through holes are exposed and developed in a photoresistor layer, the distance between the two through holes being substantially equal to the channel length of the thin film transistor. The etching stop layer is dry-etched to obtain the thin film transistor with an expected channel length.

It is to be understood that even though numerous characteristics and advantages of the present embodiments have been set forth in the foregoing description, with details of the structures and functions of the embodiments, the disclosure is illustrative only; and changes may be in detail, especially in the matter of arrangement of parts within the principles of the embodiments to the full extent indicated by the broad general meaning of the terms in which the appended claims are expressed.

What is claimed is:

1. A thin film transistor, comprising:
   a gate electrode;
   a gate insulating layer covering the gate electrode;
   a channel layer arranged on the gate insulating layer corresponding to the gate electrode;
   an etching stop layer in a double-layer structure covering the channel layer and comprising an organic stop layer and a hard mask layer, the hard mask layer located on a surface of the organic stop layer opposite to the channel layer;
   a plurality of contact holes passing through the etching stop layer;
   a source connecting to the channel layer via one of the plurality of contact holes; and
   a drain connecting to the channel layer via the another of the plurality of contact holes;
   wherein the hard mask layer enhances a hardness of the organic stop layer.

2. The thin film transistor of claim 1, wherein a photosensitivity of a photoresistor material is better than a photosensitivity of the etching stop layer.

3. The thin film transistor of claim 1, wherein a thickness of the hard mask layer is less than a thickness of the organic stop layer.

4. The thin film transistor of claim 1, wherein the hard mask layer is made of a material selected from a group of silicon nitride (SiNx), Silicon oxide (SiOx), silicon fluorion (SiFx), and silicon nitride oxide (SiNxOy).

5. The thin film transistor of claim 1, wherein a distance between the two through holes is less than ten micrometers.

6. The thin film transistor of claim 5, wherein the distance between the two through holes is about 3-5 micrometers.

7. The thin film transistor of claim 1, wherein the channel layer is made of metal-oxide semiconductor materials.

8. The thin film transistor of claim 7, wherein the channel layer is made of a material selected from a group of indium gallium zinc oxide (IGZO), zinc oxide (ZnO), indium oxide (InO), gallium oxide (GaO).

9. A display array substrate, comprising:
   a plurality of gate lines arranged in parallel;

a plurality of data lines arranged in parallel and isolatedly intersect with the gate lines;

the data lines and the gate lines defining multiple intersections where the data lines cross the gate lines, and a thin film transistor arranged on each of the multiple intersections;

the thin film transistor comprising:

a gate electrode;

a gate insulating layer covering the gate electrode;

a channel layer arranged on the gate insulating layer corresponding to the gate electrode;

an etching stop layer in a double-layer structure covering the channel layer and comprising an organic stop layer and a hard mask layer, the hard mask layer located on a surface of the organic stop layer opposite to the channel layer;

two contact holes passing through the etching stop layer; and a source connecting to the channel via one of the two contact holes; and a drain connecting to the channel via the other of the two contact holes;

wherein the hard mask layer enhances a hardness of the organic stop layer.

10. The display array substrate of claim 9, wherein a photosensitivity of a photoresistor material is better than a photosensitivity of the etching stop layer.

11. The display array substrate of claim 9, wherein a thickness of the hard mask layer is less than a thickness of the organic stop layer.

12. The display array substrate of claim 9, wherein the hard mask layer is made of a material selected from a group of silicon nitride (SiNx), Silicon oxide (SiOx), silicon fluorion (SiFx), and silicon nitride oxide (SiNxOy).

13. The display array substrate of claim 9, wherein a distance between the two through holes is less than ten micrometers.

14. The display array substrate of claim 13, wherein the distance between the two through holes is about 3-5 micrometers.

15. The display array substrate of claim 9, wherein the channel layer is made of metal-oxide semiconductor materials.

16. The display array substrate of claim 15, wherein the channel layer is made of a material selected from a group of indium gallium zinc oxide (IGZO), zinc oxide (ZnO), indium oxide (InO), gallium oxide (GaO).

* * * * *